(12) United States Patent
Harshbarger et al.

(10) Patent No.: US 6,330,382 B1
(45) Date of Patent: Dec. 11, 2001

(54) MODE CONDITIONING FOR MULTIMODE FIBER SYSTEMS

(75) Inventors: Douglas E. Harshbarger; Daniel A. Nolan; Leo C. Thomas; Carlton M. Truesdale, all of Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/442,777

(22) Filed: Jan. 19, 2000

(51) Int. Cl.[7] ........................................................ G02B 6/26
(52) U.S. Cl. ................ 385/28; 385/27; 385/31; 385/42; 385/43; 385/123; 385/126
(58) Field of Search ................. 385/27, 28, 29, 385/31, 38, 42, 43, 123, 55, 56, 126, 127, 97, 98

(56) References Cited

U.S. PATENT DOCUMENTS

| | | | |
|---|---|---|---|
| 3,779,628 | 12/1973 | Kapron et al. | 385/43 X |
| 4,440,470 | 4/1984 | Khoe | 385/33 X |
| 4,701,011 | 10/1987 | Emkey et al. | 385/34 X |
| 4,763,976 | 8/1988 | Nolan et al. | 385/43 X |
| 4,902,324 | 2/1990 | Miller et al. | 65/3.11 |
| 4,998,792 | 3/1991 | Boerstler et al. | 385/28 X |
| 5,077,815 | 12/1991 | Yoshizawa et al. | 385/28 X |
| 5,138,675 | * 8/1992 | Schofield | 385/28 |
| 5,301,252 | 4/1994 | Yanagawa et al. | 385/28 X |
| 5,337,380 | 8/1994 | Darbon et al. | 385/28 |
| 5,416,862 | * 5/1995 | Haas et al. | 385/28 |
| 5,446,820 | 8/1995 | Ishikawa et al. | 385/123 |
| 5,457,759 | * 10/1995 | Kalonji et al. | 385/31 |
| 5,647,041 | 7/1997 | Presby | 285/43 |
| 5,659,644 | * 8/1997 | DiGiovanni et al. | 385/31 |
| 5,889,906 | * 3/1999 | Chen | 385/28 |

FOREIGN PATENT DOCUMENTS

| | | | |
|---|---|---|---|
| 0 299 603 A1 | 1/1989 | (EP) | 385/28 X |
| 1409793 | 10/1975 | (GB) | 385/88 X |

OTHER PUBLICATIONS

Jedrzejewski, K. P., et al. "Tapered–Beam Expander for Single–Mode Optical–Fibre Gap Devices," Electronics Letters, Jan. 16, 1986, vol. 22, No. 2, pp. 105–106.

Barnoski, Michael K., "Fundamentals of Optical Fiber Communications," 1981, pp. 156–169.

DeBaun, Barbara A., et al.; Direct VCSEL launch into large core multimode fiber: Enhancement of the Bandwidth*Distance Product; SPIE vol. 3003; pp. 142–152.

* cited by examiner

Primary Examiner—Brian Healy
(74) Attorney, Agent, or Firm—Philip G. Alden

(57) ABSTRACT

A single mode waveguide coupling to a multimode fiber of a high-bandwidth local optical network is made by a tapered coupler that expands the spot size of the propagating beam to fill additional modes of the multimode fiber. The tapered coupler has a core surrounded by inner and outer layers of cladding. The core and the inner cladding layer are drawn down along their length to force light from the core into the surrounding inner cladding layer. The outer cladding layer confines the expanded beam within the core and inner cladding layer.

33 Claims, 3 Drawing Sheets

MODE CONDITIONING FOR MULTIMODE FIBER SYSTEMS

BACKGROUND OF THE INVENTION

1. Field of the Invention

The present invention relates generally to couplings between laser sources and multimode optical fibers, particularly for purposes of supporting consistent bandwidths over short distances.

2. Technical Background

Local area optical networks within and between buildings often employ multimode fibers for conveying high speed signals. Cores of the multimode fibers are larger in diameter than cores of single mode fibers and can carry more power. The larger core diameters also simplify splicing and alignment of the fibers with each other or with other network connections.

Most multimode fibers are tuned for use with conventional light emitting diode (LED) sources. These sources have limited modulation capability and, therefore, can only support data rates up to approximately 500 MB/s. In order to support higher speeds, such as 1.25 GB/s (as in the Gigabit Ethernet standard), systems require laser sources. However, lasers such as Fabry Perot (FP) lasers and vertical cavity surface emitting lasers (VCSELs), which are preferred for their higher power, narrower spectral width, higher modulation rates, and ability to couple to multiple arrays, generally couple less reliably to multimode fibers.

Compared with conventional LED sources, the lasers (FP lasers and VCSELs) produce smaller spot sizes that underfill the multimode fibers (i.e., not all of the modes are equally excited). Since each of the modes conveys light a little differently, the bandwidth varies between the different fill conditions. The smaller spot sizes also concentrate energy near the centers of the multimode fibers where refractive index profiles are particularly difficult to control. Small changes in the alignment of the lasers with the multimode fibers can produce further variations in the bandwidth.

Although the multimode fibers can be adjusted with respect to the laser sources to optimize bandwidth, the adjustments require in situ testing or other special attentions that can complicate and add to the costs of network installations. For example, repeated trials can be required to identify positions of alignment that support adequate bandwidth and special devices must be added to the link to ensure alignment is maintained.

SUMMARY OF THE INVENTION

Our invention provides more reliable bandwidth for multimode fiber networks. Multimode couplers arranged in accordance with our invention expand the light output beam of laser sources to more evenly fill the modes of the multimode fibers. The resulting bandwidths supported by the multimode fibers are less sensitive to alignment variations with the laser sources so that upgraded network installations can be made with FP lasers and VCSEL sources without trial and error adjustments of alignment positions.

A mode conditioned multimode fiber system according to one embodiment of our invention includes a multimode coupler having a first end connected to a laser source, a second end connected to a multimode optical fiber, and an intermediate section joining the two ends. The intermediate section of the coupler is tapered between the first and second ends to progressively increase a diameter of a single mode or other less than overfilled light beam entering the first end of the coupler from the laser source. The beam diameter is increased to a size that fills at least one-half and preferably all of the modes of the multimode optical fiber.

Within the coupler is a core surrounded by inner and outer layers of cladding. The core and at least the inner layer of the cladding are drawn down along the coupler length to smaller cross-sectional dimensions by amounts that force propagation of the beam beyond the core into the inner cladding layer. Enough inner cladding remains at the second end of the coupler to guide the expanded beam at the desired beam diameter.

The combined diameter of the core and inner cladding layer at the first end of the coupler is sized to form a single mode or slightly larger connection with the laser source. The numerical aperture and the beam diameter at the first end preferably match corresponding characteristics of the laser source. The combined diameter of the core and inner cladding layer at the second end of the coupler is sized to form a multimode connection with the multimode fiber. The numerical aperture and the beam diameter at the second end sufficiently match corresponding characteristics of the multimode fiber to excite the majority if not all of the modes of the multimode fiber. The beam diameter at the second end of the coupler is preferably equal to at least one-half of the core diameter of the multimode fiber.

A laser source, such as a FP laser or VCSEL source, can be coupled to a multimode fiber in accordance with our invention by connecting the first end of the multimode coupler to the laser source, connecting the second end of the multimode coupler to the multimode fiber, and expanding a diameter of a light beam along the length of the multimode coupler so that the modes of the multimode fiber are more evenly filled by the light beam. At least one-half to substantially all of the modes of the multimode fiber are preferably filled. The beam expansion is made by tapering a core of the multimode coupler to force more of the light beam into a surrounding inner cladding layer. An outer cladding layer confines the expanded light beam within the inner cladding layer.

The multimode coupler, which is positioned between the laser source and the multimode fiber, forms a single mode or slightly larger connection to the laser source and a multimode connection to the multimode fiber. The resulting light beam expansion reduces bandwidth sensitivity to radial alignment variations between the multimode coupler and the multimode fiber. Accordingly, the multimode couplings can be aligned to accuracies similar to couplings between multimode fibers.

Additional features and advantages of the invention will be set forth in the detailed description which follows and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention and are intended to provide an overview or framework for understanding the nature and character of the invention as it is claimed. The accompanying drawings are included to provide a further understanding of the invention and are incorporated in and constitute a part of this specification. The drawings illustrate various embodiments of the invention and together with the description serve to explain the principles and operation of the invention.

DETAILED DESCRIPTION OF THE PREFERRED EMBODIMENTS

Figure 1:
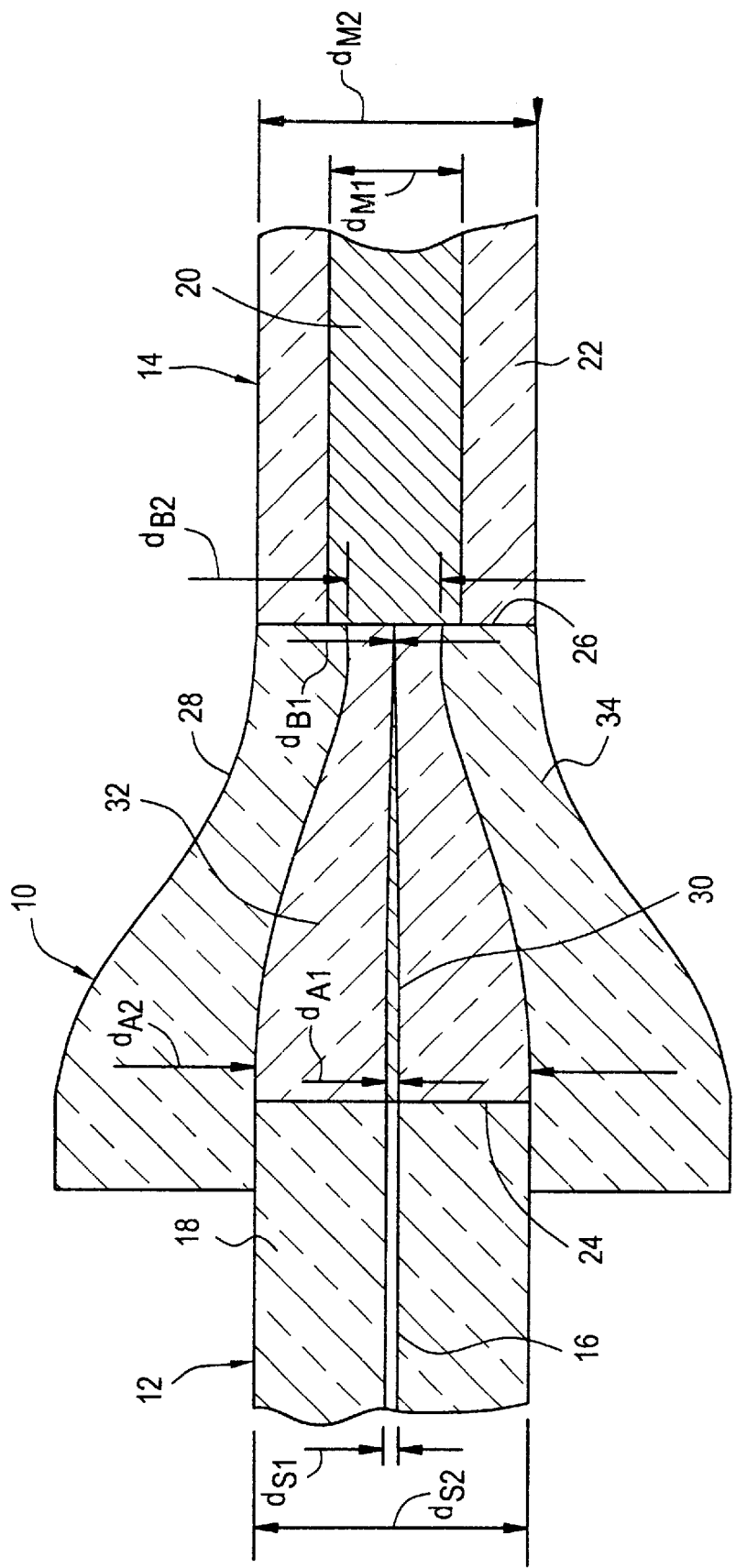
FIG. 1 is a cross-sectional view of a multimode coupler connecting a single mode fiber to a multimode fiber.

Reference will now be made in detail to the present preferred embodiments of the invention, examples of which are illustrated in the accompanying drawings. An exemplary embodiment of a multimode coupler in accordance with our invention is shown in FIG. 1 and is designated generally by reference numeral 10.

The multimode coupler 10 connects a single mode fiber 12 to a multimode fiber 14 in FIG. 1 to provide more reliable bandwidth and reduced sensitivity to alignments between the single mode and multimode fibers 12 and 14. The single mode fiber 12 and the multimode fiber 14 have conventional cores 16, 20 and cladding 18, 22. The multimode fiber core 20 has a diameter $d_{M1}$ that is several times (e.g., 7 or 8 times) larger than a diameter $d_{S1}$ of the single mode fiber core 16. However, diameters $d_{S2}$ and $d_{M2}$ of the single mode fiber cladding 18 and the multimode fiber cladding 22 can be approximately the same.

The multimode coupler 10 has first and second ends 24 and 26 joined by an intermediate section 28 having a core 30 surrounded by an inner cladding layer 32 and an outer cladding layer 34. The coupler core 30 has an initial diameter $d_{M1}$ at the first end 24 matching the diameter $d_{S1}$ of the single mode fiber 12 but is tapered along the intermediate section 28 to a smaller final diameter $d_{B1}$ at the second end 26 abutting the multimode fiber 14. Similarly, the inner cladding layer 32 of the coupler 10 has an initial diameter $d_{A2}$ approximately matching (or even larger than) the cladding diameter $d_{S2}$ of the single mode fiber 12. However, a similar taper of the inner cladding layer 32 along the intermediate section 28 results in a final diameter $d_{B2}$ that is preferably less than the diameter $d_{M1}$ of the multimode fiber core 20.

The core 30 and the inner cladding layer 32 are preferably drawn down from the diameters $d_{A1}$, $d_{A2}$ at the first end 24 to the diameters $d_{B1}$, $d_{B2}$ at the second end 26 at a taper ratio of preferably less than 5 to 1 and more commonly in the vicinity of 2.5 to 1. The length of taper (e.g., 0.5 cm) is preferably sufficient to support an adiabatic transition of light energy from the core 30 into the surrounding inner cladding layer 32.

The outer cladding layer 34, which is preferably sized from 1 to 3 millimeters in diameter, envelops the single mode fiber 12 at the first end 24 and abuts the multimode fiber 14 at the second end 26. Many other arrangements are also possible consistent with one or more functions of the outer cladding layer 34, which include contributing to structural support and protection of the underlying layers 30 and 32 and confining light within the inner cladding layer 32. The outer cladding layer 34 is preferably tapered similar to the inner cladding layer 32 and the core 30, primarily as an artifact of coupling manufacture.

For example, the coupler 10 can be formed by inserting a conventional fiber or fiber section into a capillary tube, which is heated and collapsed uniformly around the fiber. The combined fiber and tube is heated and pulled from opposite ends to produce the desired taper and is cleaved at a midsection of the taper to produce a pair of couplers.

The core 30 and the inner cladding layer 32 of the coupler 10 can be formed by the conventional fiber. The outer cladding layer 34 can be formed by the capillary tube. The tube is preferably made from silica with dopant such as boron or fluorine to lower its refractive index at least to the level of the inner cladding layer 32. The refractive index of the outer cladding layer 34 is preferably lower than the refractive index of the inner cladding layer 32 to guide light propagating along the inner cladding layer 32.

A similar coupler for different purposes is described in commonly assigned U.S. Pat. No. 4,763,976 entitled "Connector Employing Mode Field Modification" and naming two of the inventors who contributed to this invention. This patent is hereby incorporated by reference.

Figure 2:
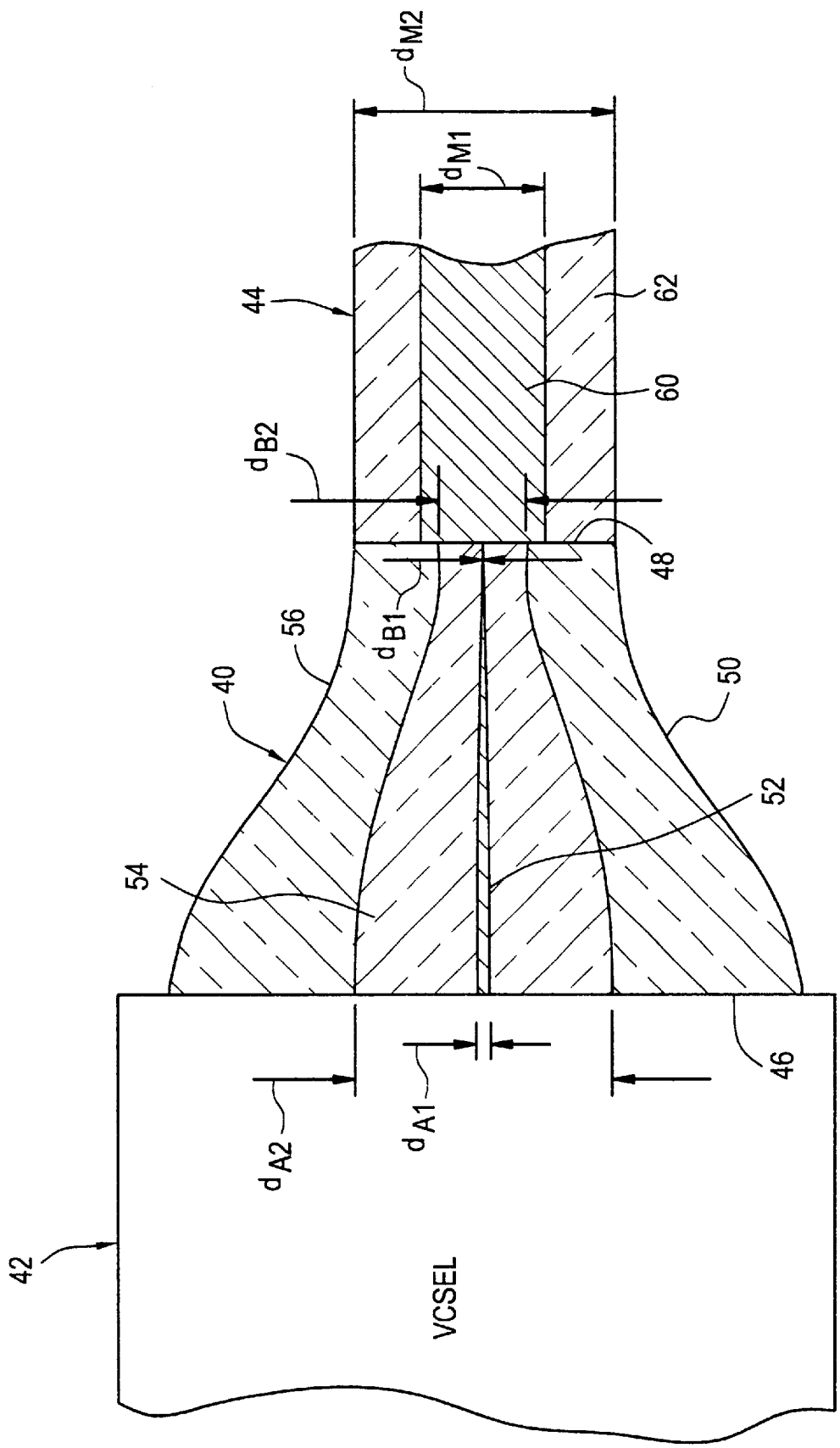
FIG. 2 is a cross-sectional view of a multimode coupler connecting a laser source to a multimode fiber.

Another multimode coupler 40 is shown in FIG. 2 coupling a vertical cavity surface emitting laser (VCSEL) 42 to a multimode fiber 44. Other lasers or other light sources could also be used, but our invention is particularly advantageous for use with lasers such as VCSELs or FP (Fabry Perot) lasers that output small spot sizes. Similar to the coupler 10, the coupler 40 includes first and second ends 46 and 48 joined by an intermediate section 50 having a core 52 surrounded by an inner cladding layer 54 and an outer cladding layer 56. The first end 46 is butt coupled to the laser 42, and the second end 48 is similarly coupled to the multimode fiber 44.

The core 52 and the inner cladding layer 54 are tapered down from the first end 46 to the second end 48 similar to the preceding embodiment. The outer cladding 56 is shown similarly tapered, but other longitudinal variations including no taper at all are possible. The multimode fiber 44 has a core 60 and a cladding 62 of usual dimensions against which the coupler 40 is sized to improve the reliability of couplings with the laser 42.

The particular dimensions of both couplers 10 and 40 are determined largely by requirements for (a) filling the modes conveyed by the multimode fibers 14 and 44, (b) reducing sensitivity to alignment variations between the couplers 10 and 40 and the multimode fibers 14 and 44, and (c) limiting transmission losses between the light sources 12 and 42 and the multimode fibers 14 and 44. The tapered cores 30 and 52 force light from the cores 30 and 52 into surrounding portions of the inner cladding layers 32 and 54. The light beams conveyed by the couplers 10 and 40 increase in diameter from the first ends 24, 46 to the second ends 26, 48.

Preferably, the beam diameters enlarged by the couplers 10 and 40 are equal to at least one-half of the diameters $d_{M1}$ of the multimode fiber cores 20 and 60 but are less than the full diameters $d_{M1}$ of the cores 20 and 60. If the beam diameters are expanded too much, light spreads beyond the multimode fiber cores 20 and 60 and is lost. If the beam diameters are expanded too little, the light does not excite enough modes of the multimode fibers 14 and 44 to provide reliable performance. Although progressively reduced in diameter from $d_{A2}$ to $d_{B2}$, the inner cladding layers 32 and 54 preferably remain of sufficient size to guide the enlarged spot size beams throughout the intermediate sections 28 and 50 of the couplers 10 and 40.

The diameters $d_{A1}$ and $d_{A2}$ of the cores 30 and 52 and inner cladding layers 32 and 54 at the first ends 24 and 46 of the couplers 10 and 40 are sized to form single mode or slightly larger connections with light sources—preferably either through the intermediacy of a single mode fiber such as the fiber 12 or directly with a source such as the laser 42. Numerical apertures and spot size diameters at the first ends 24 and 46 preferably match corresponding characteristics of the light source. Some light sources such as 850 nm VCSELs and 1300 nm FP laser sources produce output beams that are a little larger than the cores of single mode fibers. Accordingly, the diameters $d_{A1}$ and $d_{A2}$ of the cores 30 and 52 can be sized slightly larger than conventional single mode dimensions to more completely couple output from such laser sources to the multimode couplers 10 and 40.

The diameters $d_{B1}$ and $d_{B2}$ of the cores 30 and 52 and inner cladding layers 32 and 54 at the second ends 26 and 48 of the couplers 10 and 40 are sized to form multimode connections with the multimode fibers 14 and 44. The numerical apertures and spot size diameters at the second ends 26 and 48 preferably match corresponding characteristics of the multimode fibers 14 and 44 to excite the majority if not all of the modes of the multimode fibers 14 and 44.

Figure 3:
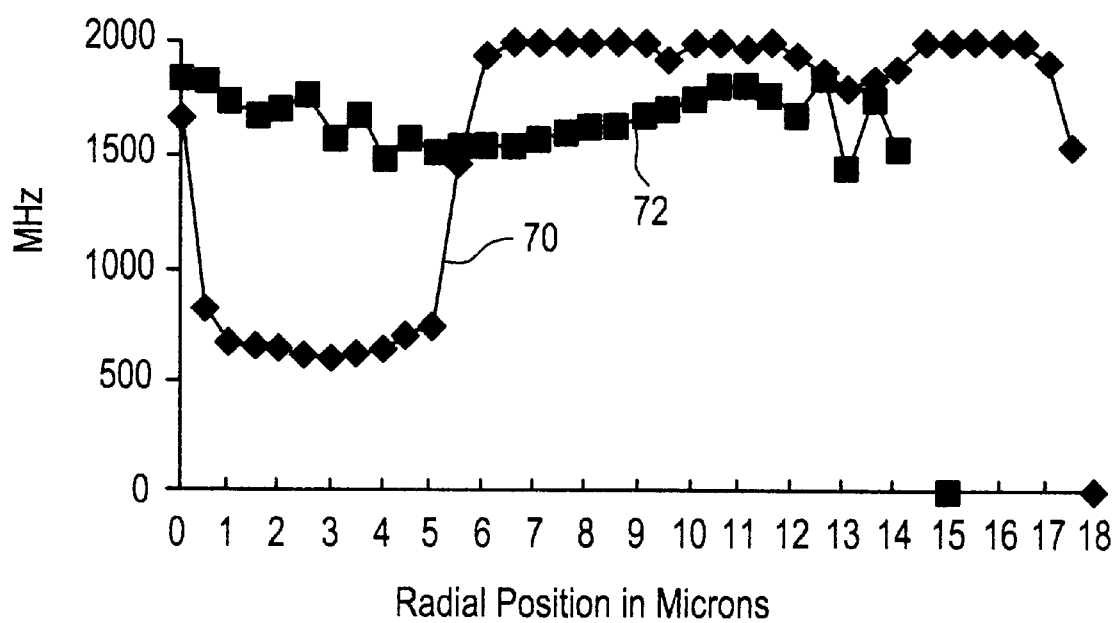
FIG. 3 is a graph comparing alignment sensitivities with and without the multimode coupler between a single mode waveguide and a multimode fiber.

An example of the reduced alignment sensitivity provided by our multimode couplers 10 or 40 is depicted in the graph of FIG. 3, which plots bandwidth as a function of radial position between a single mode waveguide and a multimode fiber. A plot 70 with data points designated as diamonds illustrates the sensitivity of a direct connection between the single mode waveguide and the multimode fiber. Although bandwidth is initially quite high at a position of perfect alignment, a small radial misalignment of less than 1 micron results in an approximately 50 percent reduction in bandwidth. Misalignments above six microns more than restore the initial bandwidth. Adjustments including trial and error adjustments between the single mode waveguide and the multimode fiber to achieve the required misalignment can add time, cost, or uncertainty to the assembly of local optical networks.

A plot 72 with data points designated by squares illustrates the more consistent performance expected by coupling the single mode waveguide to the same multimode fiber through the intermediacy of one of our multimode couplers 10 or 40. By way of numerical example, the beam size emerging from the coupler can have a (FWHM) diameter of approximately 30 to 35 microns at a numerical aperture (NA) of approximately 0.10 to 0.14. Through approximately the first 14 microns of radial misalignment, bandwidth remains quite constant. Since couplings can be routinely made within such a tolerance, the addition of our multimode couplers 10 or 40 permits reliable couplings to be made between single mode waveguides and multimode fibers supporting predictable bandwidths.

Both of the couplers 10 and 40, which are preferably mounted in a laser package housing, can be connected either directly to the laser (e.g., coupler 40) or indirectly to the laser (e.g., coupler 10) through a single mode fiber pigtail. The multimode fiber 14 or 44 can be connected to the coupler 10 or 40 later upon installation, or a limited length of the multimode fiber 14 or 44 can be connected in advance as a jumper cable so only a conventional butt coupling is needed to add additional length.

The detailed examples of our invention described above disclose our preferred embodiments of the invention. However, those of skill will appreciate that the invention can be practiced in a variety of other forms consistent with the overall teaching and contribution of the invention to the art. For example, the invention can be implemented in planar technology in which waveguide layers are formed in strata instead of concentric rings.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A mode conditioned multimode fiber system comprising:
    a light source emitting a light beam defining a spot size;
    a multimode optical fiber;
    a multimode coupler having a first end connected to the light source, a second end connected to the multimode optical fiber, and an intermediate section joining the first end and the second end, the intermediate section of the multimode coupler being tapered between the first end and the second end to increase the spot size of the light beam entering the first end of the multimode coupler from the light source, the spot size being increased along the intermediate section to fill a plurality of modes of the multimode optical fiber.

2. The system of claim 1 in which the spot size is increased to fill at least one-half of the modes of the multimode optical fiber.

3. The system of claim 1 in which the spot size is increased to fill substantially all of the modes of the multimode optical fiber.

4. The system of claim 1 in which the multimode coupler includes:
    (a) a core surrounded by inner and outer cladding layers,
    (b) a combined diameter of the core and the inner cladding layer that tapers down from the first end of the multimode coupler to the second end of the multimode coupler, and
    (c) the combined diameter at the second end of the multimode coupler being sized with respect to a core diameter of the multimode fiber to convey the light beam at a diameter equal to at least one-half the core diameter of the multimode fiber.

5. The system of claim 4 in which the outer cladding layer confines the light beam within the core and inner cladding layer at the second end of the multimode coupler.

6. The system of claim 5 in which the outer cladding layer has an inside diameter at the second end of the multimode coupler that is less than the core diameter of the multimode fiber.

7. The system of claim 4 in which the core at the first end of the multimode coupler has a diameter larger than a diameter of the light beam entering the multimode coupler from the light source.

8. The system of claim 4 in which the combined diameter at the first end of the multimode coupler is larger than the combined diameter at the second end of the multimode coupler by a multiple of at least two.

9. The system of claim 4 in which the combined diameter at the first end of the multimode coupler is larger than the combined diameter at the second end of the multimode coupler by a multiple of no more than five.

10. The system of claim 1 in which the first end of the multimode coupler is connected directly to the light source.

11. The system of claim 1 in which the first end of the multimode coupler is connected to the light source through a single mode fiber.

12. The system of claim 1 in which the first end of the multimode coupler forms a single mode connection to the light source.

13. The system of claim 1 in which the light source is a vertical cavity surface emitting laser.

14. The system of claim 1 in which the light source is a Fabry-Perot laser.

15. A method of coupling a laser source to a multimode fiber comprising the steps of:
   connecting a first end of a multimode coupler to the laser source;
   connecting a second end of the multimode coupler to the multimode fiber;
   directing a beam of light from the laser source to the first end of the multimode coupler; and
   expanding a spot size of the beam of light along a length of the multimode coupler so that modes of the multimode fiber are more evenly filled by the beam of light.

16. The method of claim 15 in which the step of expanding includes expanding the spot size to fill more than one-half of the modes of the multimode fiber.

17. The method of claim 15 in which the step of expanding includes expanding the spot size to fill substantially all of the modes of the multimode fiber.

18. The method of claim 15 in which the step of expanding includes expanding the spot size to a diameter equal to at least one-half of a core diameter of the multimode fiber.

19. The method of claim 15 in which the step of expanding includes tapering a core of the multimode coupler along the coupler length to expand the light beam into a surrounding cladding region.

20. The method of claim 15 in which the step of connecting the first end includes connecting the first end directly to the laser source.

21. The method of claim 15 in which the step of connecting the first end includes connecting the first end to the laser source through the intermediacy of a single mode fiber.

22. The method of claim 15 in which the step of connecting the first end includes forming a single mode connection with the laser source.

23. The method of claim 15 in which the step of connecting the first end includes connecting the first end to a vertical cavity surface emitting laser.

24. The method of claim 15 in which the step of connecting the first end includes connecting the first end to a Fabry-Perot laser.

25. A method of increasing a number of modes excited in a multimode fiber by a laser source emitting a light beam having a spot size, the method comprising the steps of:
   positioning a multimode coupler between the laser source and the multimode fiber, the multimode coupler having a first end and a second end and being tapered in an intermediate section between the first end and the second end so as to increase the spot size of the light beam entering the first end from the laser source to fill a plurality of modes of the multimode fiber;
   forming a single mode connection between the laser source and the first end of the multimode coupler; and
   forming a multimode connection between the second end of the multimode coupler and the multimode fiber.

26. The method of claim 25 in which the step of forming the single mode connection includes matching a numerical aperture and spot size diameter of the first end of the multimode coupler to a numerical aperture and spot size diameter from the laser source.

27. The method of claim 25 in which the step of forming the multimode connection includes matching a numerical aperture and spot size diameter of the second end of the multimode coupler to a numerical aperture and spot size diameter of the multimode fiber sufficient to excite at least one-half of the modes of the multimode fiber.

28. The method of claim 27 in which the numerical aperture and spot size diameter of the second end of the multimode coupler are matched sufficient to excite substantially all of the modes of the multimode fiber.

29. The method of claim 25 comprising a further step of expanding a beam from the laser source between the first and second ends of the multimode coupler.

30. The method of claim 29 in which the beam is expanded by an amount that reduces bandwidth sensitivity to alignment variations between the second end of the multimode coupler and the multimode fiber.

31. A method for increasing a number of modes excited in a multimode fiber by a laser source emitting a light beam having a spot size, the laser source having an optical fiber optically connected thereto, the method comprising the step of:
   fusing a multimode coupler between the optical fiber which is optically connected to the laser source and the multimode fiber, such that a single-mode connection is formed between the optical fiber and the multimode coupler, and a multimode connection is formed between the multimode coupler and the multimode fiber.

32. The method of claim 31 wherein the multimode coupler has a tapered intermediate section to increase the spot size of the light beam from the laser source to fill a plurality of modes of the multimode fiber.

33. The method of claim 31 wherein the optical fiber and the multimode fiber each have a longitudinal axis, such that the longitudinal axis of the optical fiber is generally parallel with the longitudinal axis of the multimode fiber.

* * * * *